United States Patent [19]

Barakat et al.

[11] Patent Number: 5,379,400
[45] Date of Patent: Jan. 3, 1995

[54] METHOD AND SYSTEM FOR DETERMINING MEMORY REFRESH RATE

[75] Inventors: Edmond H. Barakat, Boca Raton; Robert B. Haig, Delray Beach, both of Fla.

[73] Assignee: International Business Machines Corp., Armonk, N.Y.

[21] Appl. No.: 926,883

[22] Filed: Aug. 7, 1992

[51] Int. Cl.$^6$ .............................................. G11C 7/00
[52] U.S. Cl. ................................... 395/425; 365/222
[58] Field of Search ..................... 395/425; 365/222

[56] References Cited

U.S. PATENT DOCUMENTS

| | | | |
|---|---|---|---|
| 3,800,295 | 3/1974 | Anderson, Jr. et al. | 365/222 |
| 4,887,240 | 12/1989 | Garverick et al. | 365/222 |
| 4,943,960 | 7/1990 | Komatsu et al. | 365/222 |
| 4,970,418 | 11/1990 | Masterson | 307/480 |
| 5,021,951 | 6/1991 | Baba | 364/200 |
| 5,033,027 | 7/1991 | Amin | 365/222 |
| 5,278,796 | 1/1994 | Tillinghast et al. | 365/211 |

OTHER PUBLICATIONS

"Programmable Memory Controller" B. S. Quach, et al., IBM Tech. Discl. Bulletin vol. 31, No. 9, Feb. 1989, p. 351.
"Synchronous Memory Refresh Scheme which Supports Several Refresh Rates without Jumpers on Cards or Planars", IBM Tech. Discl., vol. 32, No. 8B, Jan. 1990.
"Self-Configuring Lookup-Table-Controlled DRAM Memory Controller", W. R. Hardell, Jr., et al. IBM Tech. Discl., vol. 33, No. 6A, Nov. 1990, p. 265.
"Optimum Timing Auto-Configurable Microcoded Memory Controller", W. R. Hardell, Jr., et al. IBM Tech. Discl., vol. 33, No. 6A, Nov. 1990, p. 369.

Primary Examiner—David L. Robertson
Attorney, Agent, or Firm—Daniel E. McConnell; John N. Kastelic

[57] ABSTRACT

A computer system is provided wherein dynamic random access memory within the system is refreshed by executing one of two refresh cycles. The computer system includes system dynamic random access memory and optional expansion dynamic random access memory which may be installed on an input/output bus. Circuitry is provided for detecting if at least one input/output device having dynamic random access memory incorporated therein is installed on the input/output bus. A refresh control unit incorporates control logic for alternatively executing (i) a first refresh cycle if no input/output device is connected to the input/output bus or (ii) a second refresh cycle if at least one of the input/output devices is connected to the input/output bus. The first refresh cycle is a faster than the second refresh cycle.

17 Claims, 3 Drawing Sheets

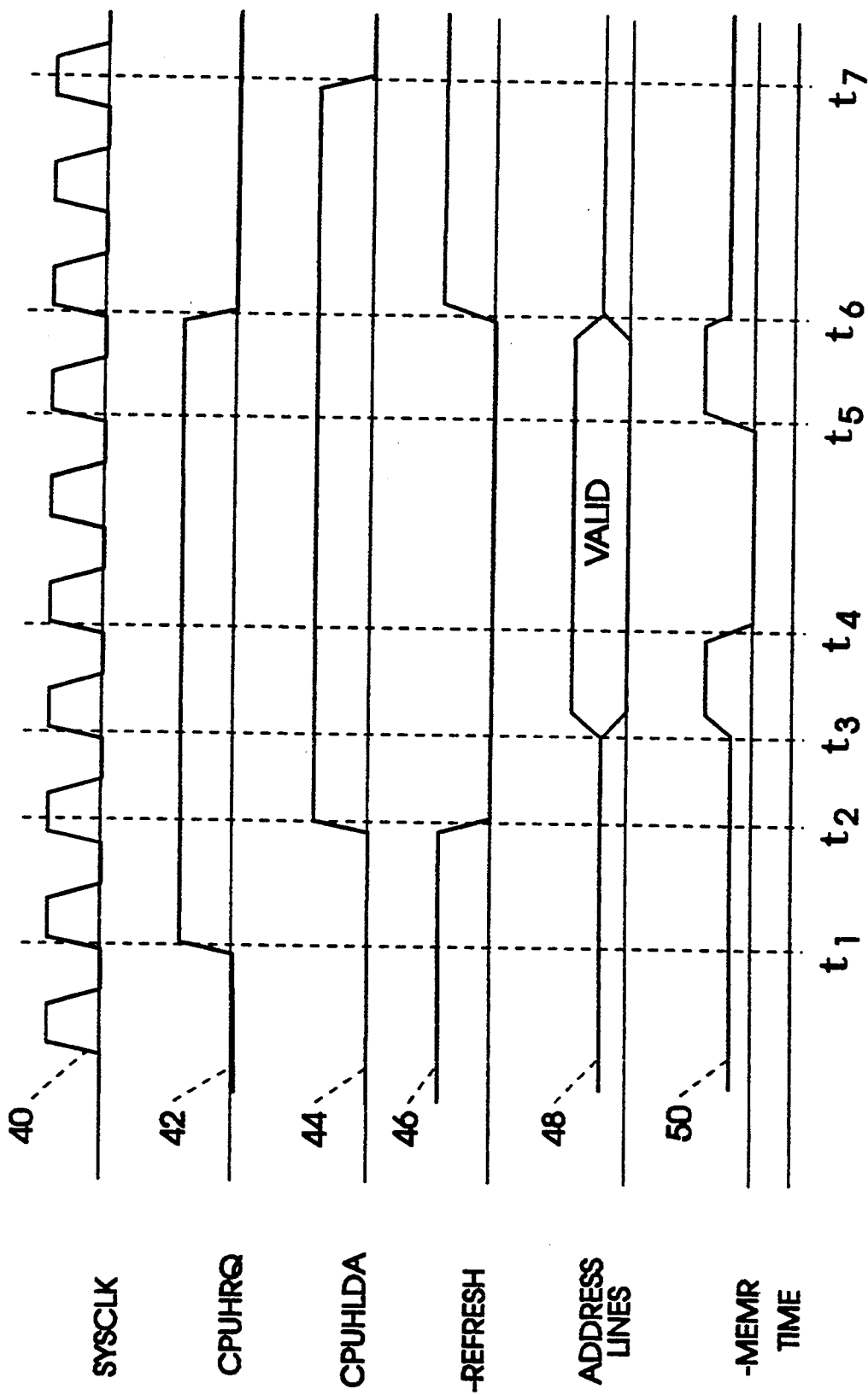

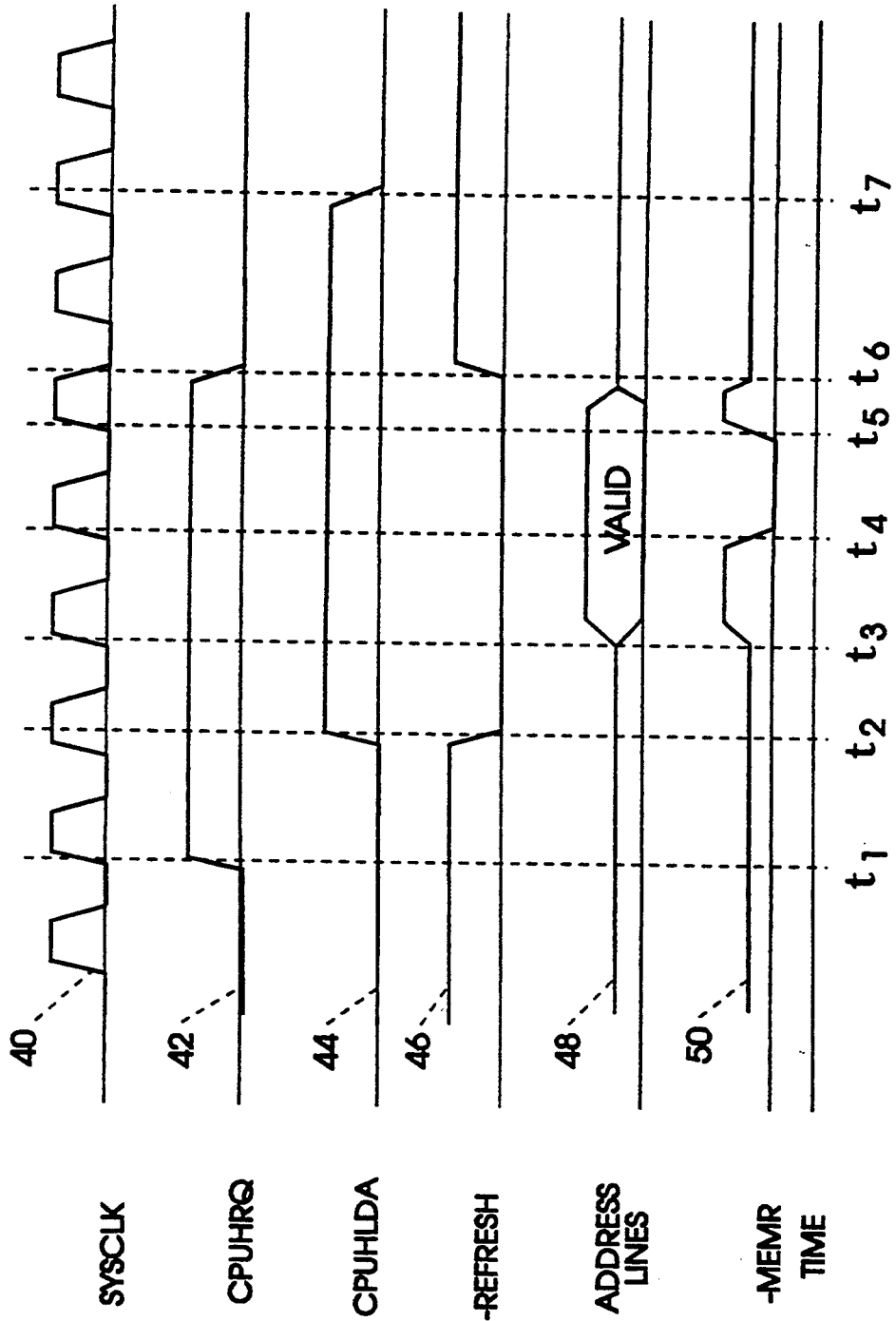

METHOD AND SYSTEM FOR DETERMINING MEMORY REFRESH RATE

TECHNICAL FIELD

The present invention relates generally to computer hardware and particularly to a method and logic for implementing dynamic random access memory refresh cycles in the system.

BACKGROUND OF THE INVENTION

Generally in computer systems, and especially in personal computer systems, data is transferred between system devices such as a central processing unit (CPU), memory devices, memory controllers and various input/output (I/O) devices. The memory devices may include system memory, memory located on the various I/O devices, or expansion memory which may be added to the system in the form of plug-in adapter cards. Typically, the system or expansion memory includes dynamic random access memory (DRAM) devices.

The use of DRAM devices as memory devices in computer systems is widespread, due in part to the reasonable cost of DRAM devices as compared to other memory devices. DRAM devices also offer the benefit of not requiring back-up power to store information therein. Rather, information is stored in the form of electrical charge which represents data. The memory structure of the DRAM comprises matrices of capacitors for storing the electrical charge. Information is represented by the presence or absence of electrical charge in these storage capacitors.

Although DRAM devices do not require battery back-up power to retain their contents, the charge storing capacitors located therein need to be periodically refreshed in order to retain the stored information. The charge stored in the DRAM storage cells is rather minimal, and is prone to leak from the storage capacitors over time, resulting in data which may eventually be corrupted. Unless the DRAM devices are refreshed, stored data may be permanently lost.

In a typical refresh cycle, the data represented by the charged capacitors in the DRAM is periodically read out, amplified, and written back to the DRAM to prevent data corruption. Refresh cycles occur at a specific frequency and operate for a particular duration. Typically, the DRAM device manufacturer will specify a time period during which a refresh cycle must occur to insure against data corruption. The duration of the refresh cycle operating at this specified frequency depends on the type of DRAM devices incorporated into the system. Typically, DRAM incorporated into system memory on the system planar is capable of being refreshed faster than DRAM which resides on the various I/O devices or expansion memory which optionally may be added to the system.

The storage capacity of DRAM devices which can be supported within system memory has increased over the years, as has the speed of these DRAM devices. For example, the system memory available on an IBM AT bus architecture is 16 megabytes and is capable of being refreshed during access periods on the order of 70 nanoseconds. Accordingly, the need for optional expansion memory to supplement the system memory has decreased. Present methods of refreshing DRAM devices, however, do not distinguish between systems with and without expansion DRAM, relying instead on refresh cycles which are slow enough to accommodate both types of DRAM in the systems.

Accordingly, it is an object of the present invention to provide a method and logic for refreshing DRAM devices in a computer system which takes advantage of advances in system memory architecture by providing two speeds at which refresh cycles may operate in the system, depending upon whether or not optional DRAM memory is installed in the system.

SUMMARY OF THE INVENTION

The present invention provides a method and logic for implementing dynamic random access memory refresh cycles in a computer the system. The system comprises a main system board or planar and one or more optional expansion DRAM cards, which are installed into an input/output (I/O) bus. The I/O bus connects the optional memory cards with a bus control unit located on the planar. The system planar includes a central processing unit (CPU), system DRAM, a system DRAM controller and a refresh control unit. The CPU, the DRAM controller and the refresh control unit are connected together by a local bus, and the system DRAM and the system DRAM controller are connected by a memory bus. The bus control unit manages control of data transfer over and between the local bus and the I/O bus. The memory, local and I/O bases are collectively referred to as the system bus.

Both the system DRAM on the planar and optional DRAM memory cards are refreshed at the same time. Because system DRAM typically may be refreshed at faster speeds than expansion DRAM, the present invention provides the means to determine whether or not expansion DRAM devices are present within the system. Based on this determination, the refresh control unit executes one of two refresh cycles. The faster of the two refresh cycles may be implemented only if it is determined that no expansion DRAM is present on the I/O bus.

The refresh control unit includes a timer which times out every 15 microseconds ($\mu$sec). Upon timing out, the refresh control unit requests from the CPU access to the local bus. Upon gaining control of the local bus, the refresh control unit is able to execute one of the two refresh cycles, each of which refreshes a row of cells in a cell matrix which makes up the particular DRAM device being refreshed.

During the slower of the two refresh cycles, the CPU must relinquish control of the system bus to the refresh control unit for around six CPU clock cycles (125 nanoseconds each), or about 750 nanoseconds. During the fast refresh cycle, however, the CPU need only relinquish control of the system bus to the refresh control unit for around four of these clock cycles, or about 500 nanoseconds. As compared to the slow refresh cycle, this represents a 250 nanosecond time period occurring each 15 $\mu$sec during which the CPU is provided additional access time to the system bus. Because refresh cycles are executed every 15 $\mu$sec, this 250 nanosecond time savings during each refresh cycle results in around a 2% performance improvement.

BRIEF DESCRIPTION OF THE DRAWINGS

FIG. 2 is a timing diagram showing the slower refresh cycle occurring when DRAM devices are present on both the system planar and the input/output bus; and FIG. 3 is a timing diagram showing the faster refresh cycle occurring when DRAM devices are present only on the system planar.

DETAILED DESCRIPTION OF THE PREFERRED EMBODIMENT

Figure 1:
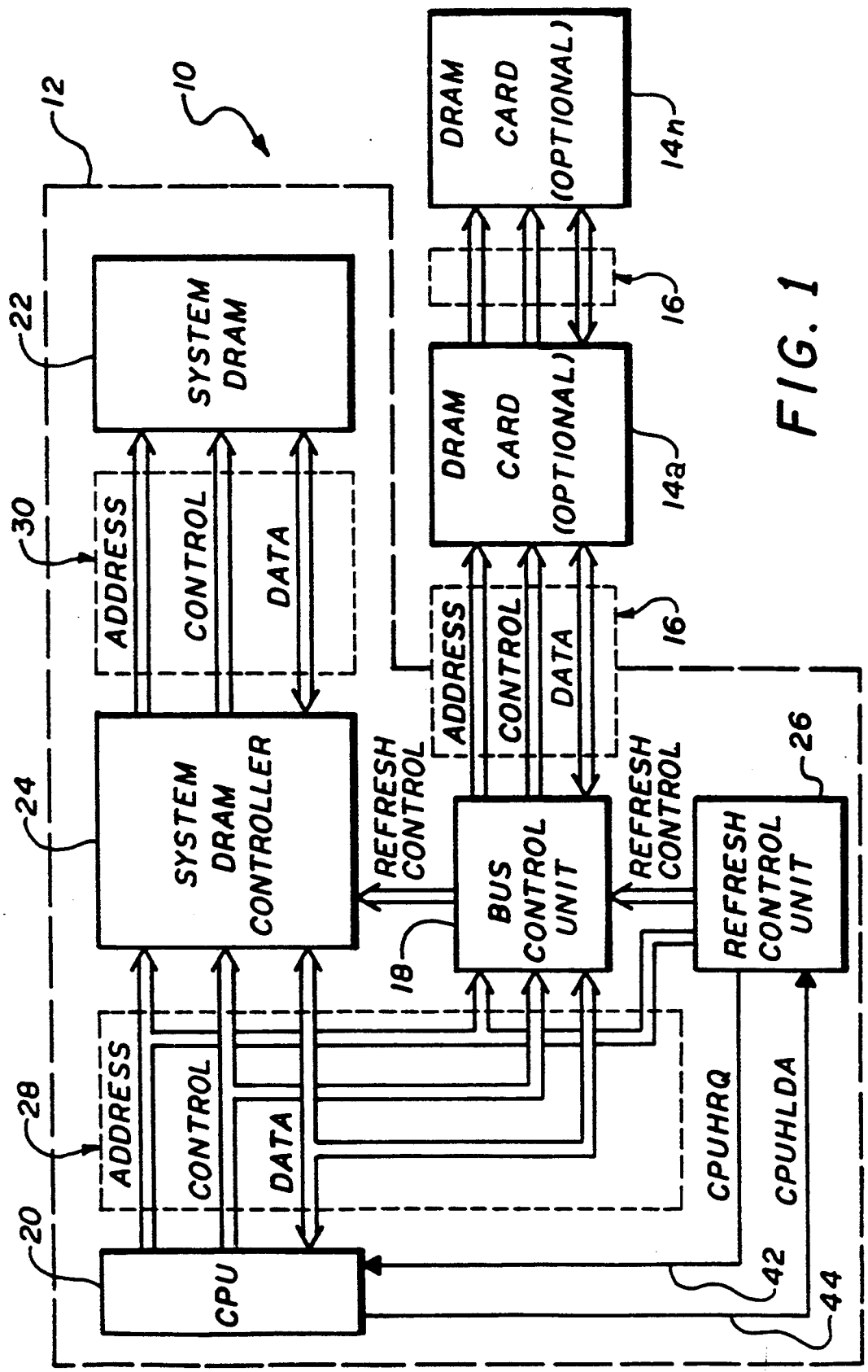
FIG. 1 is a schematic diagram of a computer system implementing the DRAM refresh logic of the present invention.

Referring now to the drawings, FIG. 1 shows a computer system 10 which utilizes the improved DRAM refresh logic of the present invention. The system 10 comprises a main system board or planar 12 and one or more optional DRAM cards 14a–14n. The optional DRAM cards are plugged into an input/output (I/O) bus 16 which connects the memory cards with a bus control unit 18 located on the planar 12. Although DRAM cards are shown in FIG. 1, the present invention may be implemented in a system where DRAM is provided on a variety of I/O devices installed in the I/O bus 16.

The system planar 12 includes a central processing unit (CPU) 20, system DRAM 22, a system DRAM controller 24 and a refresh control unit 26. The CPU 20, the DRAM controller 24 and the refresh control unit 26 communicate with each other over a local bus 28. The system DRAM 22 and the system DRAM controller 24 are connected by a memory bus 30. The bus control unit manages control of data transfer over and between the local bus 28 and the I/O bus 16. Each of the buses in the system 10 comprises address, control and data lines. Collectively, the local, memory and I/O buses are referred to as the system bus. The bus architecture shown in FIG. 1 is the IBM AT bus architecture, although implementation of the present invention is contemplated with other types of computer bus architectures.

All DRAM in the system, both system DRAM 22 on the planar and optional DRAM memory cards 14a–14n, is refreshed at the same time. In the IBM AT bus environment, the optional memory cards 14a–14n are typically refreshed at slower refresh cycle times than is the system DRAM 22 on the planar 12. For example, present designs for the system DRAM 22 require only about 70 nanoseconds to be refreshed, while optional memory cards 14a–14n of previous design require at least 250 nanoseconds. The DRAM refresh cycles, however, must be sufficiently long to refresh all of the DRAM devices in the system, including the slowest devices on the optional DRAM memory cards 14a–14n. Accordingly, the factor limiting the speed at which refresh cycles may be executed is the slowest refresh cycle time for a particular optional DRAM memory cards 14a–14n.

The refresh control unit 26 forms the basis of the present invention and provides circuit means to (i) determine whether the system is configured with system DRAM 22 alone or is provided with one or more optional DRAM cards 14a–14n and (ii) executes one of two DRAM refresh cycles depending upon this determination. The faster of the two refresh cycles may be implemented if only system DRAM is present on the planar 12.

The refresh control unit in the preferred embodiment is implemented in hardware form on a custom integrated circuit VL82C306 chip, manufactured by VLSI Technology, Inc. of San Jose, Calif. The VL82C306 chip provides all of the control circuitry necessary to generate either of the two refresh cycles for the DRAM located within the system 10. The refresh control unit includes a timer which times out every 15 microseconds ($\mu$sec). The timer in the preferred embodiment is a type 8254 timer. Upon timing out, the refresh control unit 26 requests from the CPU 20 access to the system bus. Upon gaining control of the system bus, the refresh control unit 26 is able to execute refresh cycles, each of which refreshes a row of cells in a cell matrix which makes up the particular DRAM device being refreshed.

The VL82C306 chip is also provided with a counter which is incremented after each particular refresh cycle so that the next contiguous row of cells in the DRAM device may be refreshed during each subsequent refresh cycle. The entire DRAM device is refreshed approximately every 4 milliseconds. Typically, DRAM manufacturers design DRAM devices so that the entire DRAM device may be refreshed every 4 milliseconds as long as the individual rows are refreshed during each 15 microsecond time interval.

In the preferred embodiment, port 105h bit[5] of the VL82C306 chip is used to enable or disable fast refresh cycles. Of course, the particular port utilized on the refresh control unit is not critical to the present invention and is provided by way of example only. During system power-up, the CPU 18 performs initialization and diagnostic functions. The system DRAM controller 24 examines the status of the I/O bus 16 to determine if any optional DRAM cards 14a–14n reside on the I/O bus. If such optional DRAM exists, port 105h bit[5] of the refresh control unit 26 is set to 0. If no such optional DRAM exists, and only system DRAM 22 is present, port 105h bit[5] of the refresh control unit 26 is set to 1. Based on the status of port 105h bit[5], the refresh control unit 26 executes one of two DRAM refresh cycles.

FIGS. 2 and 3 illustrate the two DRAM refresh timing diagrams which are alternatively executed by the refresh control unit 26. FIG. 2 shows the refresh cycle which is executed by the refresh control unit 26 when optional DRAM cards 14a–14n are installed on the I/O bus 16, and FIG. 3 shows the refresh cycle which is executed by the refresh control unit 26 when no optional DRAM cards 14a–14n are installed on the I/O bus 16. Each of these timing diagrams presumes that the system 10 has been powered-up, that the system DRAM controller 24 has properly set the status of port 105h bit[5] of the refresh control unit 26, and that the timer on the refresh control unit 26 has timed out during one of its 15 $\mu$sec intervals, thereby indicating that a refresh cycle needs to be executed.

The CPU 20 and the refresh control unit 26 operate on separate eight megahertz clocks. The SYSCLK signal 40 in FIGS. 2 and 3 represents the CPU clock, each cycle of which occupies a 125 nanosecond time interval. As will be further explained below, during the slower of the two refresh cycles (FIG. 2), the CPU 20 must relinquish control of the system bus to the refresh control unit 26 for around six of these clock cycles, or about 750 nanoseconds. During the fast refresh cycle shown in FIG. 3, however, the CPU 20 need only relinquish control of the system bus to the refresh control unit 26 for around four of these clock cycles, or about 500 nanoseconds. Because refresh cycles are executed every 15 $\mu$sec, this 250 nanosecond time savings each refresh cycle results in around a 2% performance improvement.

As shown specifically in FIG. 2, CPUHRQ signal 42 is issued by the refresh control unit 26 when the 15 $\mu$sec timer therein times out. The CPUHRQ signal represents a hold request by the refresh control unit to the CPU 20 at time $t_1$, indicating that the refresh control unit 26 needs to access and obtain control of the system bus to perform a refresh cycle of system DRAM 22 and the expansion DRAM 14a–14n. The CPU 20 responds to the CPUHRQ signal by acknowledging the request with a CPUHLDA acknowledge signal 44 at time $t_2$ (see also FIG. 1). The CPUHRQ signal 42 and the CPUHLDA acknowledge signal 44 do not directly pass between the CPU 20 and the refresh control unit 26 if more than one CPU is used in the system 10. In such a case, an arbitration unit (not shown) is located between the CPU and the refresh control unit and the CPUHRQ signal 42 and the CPUHLDA acknowledge signal 44 pass therethrough.

Because the CPU 20 and the refresh control unit 26 operate on asynchronous eight megahertz clocks, the CPUHLDA signal 44 is latched on the next falling edge of the CPU SYSCLK signal 40 to synchronize refresh control unit 26 operation with the CPU 20. Once the CPUHLDA acknowledge signal 44 is driven active by the CPU 20, the CPU loses control of the system bus and the refresh control unit 26 has assumes control. The refresh control unit 26 immediately drives a —REFRESH enable signal 46 low (active) at time $t_2$ and latched at time $t_3$ on the next rising edge of the SYSCLK signal 40 after the CPUHLDA signal is driven active by the CPU 20.

As explained above, the refresh control unit 26 is provided with a counter which is incremented after each refresh cycle so that during a subsequent refresh cycle, the next contiguous row of cells in the system DRAM and the expansion DRAM may be refreshed. The counter initially starts with the first row of DRAM cells in the devices. Based on the counter status, ADDRESS LINES 48 corresponding to this row are driven valid on the next rising edge of the SYSCLK signal 40 at time $t_3$. Both the CPU 20 and the refresh control unit 26 share access to the ADDRESS LINES 48. When the ADDRESS LINES 48 are valid, cells corresponding to these address locations may be refreshed.

Upon the next rising edge of the SYSCLK signal 40 at time $t_4$, the refresh control unit 26 drives a memory read —MEMR signal 50 active (low). The refresh control unit drives the —MEMR signal active whenever the —REFRESH signal 46 is active and ADDRESS LINES 48 are valid. In this manner the refresh control unit distinguishes between a refresh cycle and an ordinary memory read cycle. The —MEMR signal remains active for two full SYSCLK cycles (250 nanoseconds) until time $t_5$, while the DRAM within the system is refreshed. This 250 nanosecond time period is required because slower DRAM on the optional expansion cards 14a–14n is present in the system, even though the system DRAM requires only about 70 nanoseconds to be refreshed.

At the end of the refresh cycle at time $t_5$, the refresh control unit 26 drives the —MEMR signal 50 inactive (high). Upon occurrence of the next rising edge of the SYSCLK signal 40, at time $t_6$, the ADDRESS LINES 48 are no longer valid, the —REFRESH signal 46 is driven inactive (high) by the refresh control unit 26, and the refresh control unit drops its system bus request CPUHRQ signal 42. At this time, the counter in the refresh control unit 26 is incremented to the memory address locations corresponding to the next row of DRAM cells to be refreshed. The counter eventually wraps around to the first row after all of the rows in the DRAM have been refreshed. At time $t_7$ the CPUHLDA acknowledge signal 44 is driven inactive by the CPU 20.

Accordingly, during the slow refresh cycle illustrated by the timing diagram of FIG. 2, the CPUHRQ signal 42 is active for six full SYSCLK cycles, or 750 nanoseconds, from time $t_1$ to time $t_6$. During these 750 nanoseconds, the refresh control unit 26 retains control of the system bus and thus the CPU 20 is prevented from performing operations on the bus. This 750 nanosecond interval is provided for the refresh control unit 26 every 15 μsec to perform DRAM refresh operations.

If port 105h bit[5] is set to 1 on power-up, however, the status of this port on the refresh control unit 26 indicates that no optional DRAM cards 14a–14n are installed in the I/O bus 16, and that only system DRAM 22 is present. In this case, faster DRAM refresh cycles may be executed by the refresh control unit 26. A timing diagram for a faster refresh cycle is illustrated in FIG. 3.

The timing diagram for a fast refresh cycle is identical to that for a slow refresh cycle (FIG. 2) for times $t_1$ through $t_4$. At time $t_4$, on a rising edge of the SYSCLK signal 40, the refresh control unit 26 drives the memory read —MEMR signal 50 active (low). However, the —MEMR signal 50 remains active for only one full SYSCLK cycle during a fast refresh cycle, from time $t_4$ to time $t_5$ (125 nanoseconds), while the DRAM within the system is refreshed. This 125 nanosecond time period is more than sufficient to refresh the system DRAM 22 which requires only about 70 nanoseconds to be refreshed. At the end of the refresh cycle, at time $t_5$ on the next rising edge of the SYSCLK signal 40, the refresh control unit 26 drives the —MEMR signal 50 inactive (high).

During a fast refresh cycle, the ADDRESS LINES 48 are not driven valid by the refresh controller past the duration of the entire —MEMR signal active period. Because the ADDRESS LINES 48 are latched by the system DRAM controller 24, there is no need to drive the ADDRESS LINES valid past time $t_5$. Accordingly, at time $t_6$, the —MEMR signal 50 is driven inactive and the ADDRESS LINES 48 are also driven invalid. Also at time $t_5$, the refresh control unit 26 drops its system bus request CPUHRQ signal 42. Again, as with the slow refresh cycle, the counter in the refresh control unit 26 is incremented to the memory address locations corresponding to the next row of DRAM cells to be refreshed during the next refresh cycle.

At the end of the refresh cycle, the —REFRESH signal 46 is driven inactive (high) on the next filling edge of the SYSCLK signal 40, at time $t_6$. At time $t_7$, the CPUHLDA acknowledge signal 44 is driven inactive by the CPU 20. Thus, during the fast refresh cycle illustrated by the timing diagram of FIG. 3, the CPUHRQ signal 42 is active for only four full SYSCLK cycles from time $t_1$ to time $t_5$, or 500 nanoseconds, during which time the refresh control unit 26 retains control of the system bus, thereby preventing the CPU 20 from performing operations on the bus. As compared to the slow refresh cycle, this represents a 250 nanosecond time period occurring each 15 μsec, during which time the CPU 20 is provided with additional access to the system bus.

Accordingly, the preferred embodiment of a method and logic for refreshing dynamic random access memory in a computer system has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

We claim:

1. A computer system, comprising:
   system dynamic random access memory and a dynamic random access memory controller connected thereto by a memory bus, said system memory capable of being refreshed during a first access period;
   a central processing unit connected to said dynamic random access memory controller by a local processor bus;
   a bus control unit for monitoring and controlling activity on said local processor bus and on an input/output bus, said local processor, I/O and memory buses forming a system bus;
   circuitry for detecting if at least one input/output device having expansion dynamic random access memory incorporated therein is connected to said bus control unit by said input/output bus, said expansion dynamic random access memory requiring a second access period in which to be refreshed, said second access period being of a longer duration than said first access period; and
   a refresh control unit incorporating control logic for alternatively executing either (i) a first refresh cycle if no expansion dynamic random access memory is detected in the system or (ii) a second refresh cycle if expansion dynamic random access memory is detected in the system, said first refresh cycle being a faster process than said second refresh cycle.

2. The computer system of claim 1, wherein said central processing unit relinquishes control of said system bus to said refresh control unit during execution of one of said first and second refresh cycles.

3. The computer system of claim 1, wherein said local processor bus, said memory bus and said input/output bus conform to IBM AT bus architecture.

4. The computer system of claim 3, wherein said central processing unit and said refresh control unit operate on separate clocks operating at about eight megahertz, and further comprising circuitry for synchronizing operations of said central processing unit and said refresh control unit which are based on clock cycles provided by said separate clocks.

5. The computer system of claim 3, wherein said first and said second refresh cycles are alternatively executed depending upon the status of an input port to said refresh control unit.

6. The computer system of claim 5, wherein said first or second refresh cycles are executed about every 15 μsec.

7. The computer system of claim 1, wherein said system dynamic random access memory and said input/output device having dynamic random access memory incorporated therein are refreshed simultaneously.

8. The computer system of claim 7, wherein a single row of cells in said system dynamic random access memory and said input/output device having dynamic random access memory incorporated therein are refreshed during each refresh cycle.

9. The computer system of claim 8, wherein said refresh control unit is provided with a counter the count of which is incremented after each successive refresh cycle, said count corresponding to a given row of cells in said system dynamic random access memory and said input/output device having dynamic random access memory incorporated therein.

10. A method of refreshing dynamic random access memory in a computer system including a central processing unit and further providing (i) system dynamic random access memory and (ii) optional expansion dynamic random access memory incorporated into at least one input/output device connected to the system via an input/output bus, said expansion dynamic random access memory requiring an access period in which to be refreshed which is longer than that required by said system dynamic random access memory, said method comprising the steps of:
   providing a single refresh control unit for all dynamic random access memory in the system for alternatively executing either a first refresh cycle or a second refresh cycle depending on whether expansion dynamic random access memory is present in the system;
   detecting if at least one input/output device having dynamic random access memory is connected to the system via the input/output bus;
   setting a binary status of an input port on said refresh control unit depending on whether or not at least one input/output device having dynamic random access memory has been detected; and
   executing either said first or said second refresh cycle depending upon the status of said input port.

11. The method of claim 10, wherein said first refresh cycle is a faster process than said second refresh cycle.

12. The method of claim 10, wherein said computer system conforms to IBM AT bus architecture.

13. The method of claim 12, wherein said central processing unit and said refresh control unit operate on separate clocks operating at about eight megahertz, and further comprising circuitry for synchronizing operations of said central processing unit and said refresh control unit which are based on clock cycles provided by said separate clocks.

14. The method of claim 12, wherein said first or second refresh cycles are executed about every 15 μsec.

15. The method of claim 10, wherein said system dynamic random access memory and said input/output device having dynamic random access memory incorporated therein are refreshed simultaneously.

16. The method of claim 15, wherein a single row of cells in said system dynamic random access memory and said input/output device having dynamic random access memory incorporated therein are refreshed during each refresh cycle.

17. The method of claim 16, wherein said refresh control unit is provided with a counter the count of which is incremented after each successive refresh cycle, said count corresponding to a given row of cells in said system dynamic random access memory and said input/output device having dynamic random access memory incorporated therein.

* * * * *